(12) United States Patent
Wechsler et al.

(10) Patent No.: US 10,905,034 B2
(45) Date of Patent: Jan. 26, 2021

(54) RECEIVING DEVICE AND METHOD FOR PRODUCTION

(71) Applicants: Bombardier Primove GmbH, Berlin (DE); AUDI AG, Ingolstadt (DE)

(72) Inventors: Simon Wechsler, Hirschberg (DE); Roman Gunt, Heidelberg (DE)

(73) Assignees: Bombardier Primove GmbH, Berlin (DE); AUDI AG, Ingolstadt (DE)

( * ) Notice: Subject to any disclaimer, the term of this patent is extended or adjusted under 35 U.S.C. 154(b) by 0 days.

(21) Appl. No.: 16/480,768

(22) PCT Filed: Jan. 24, 2018

(86) PCT No.: PCT/EP2018/051686
§ 371 (c)(1),
(2) Date: Jul. 25, 2019

(87) PCT Pub. No.: WO2018/138128
PCT Pub. Date: Aug. 2, 2018

(65) Prior Publication Data
US 2019/0394909 A1    Dec. 26, 2019

(30) Foreign Application Priority Data

Jan. 26, 2017 (DE) ........................ 10 2017 101 582

(51) Int. Cl.
| | | |
|---|---|---|
| *H05K 7/20* | (2006.01) | |
| *H02J 50/10* | (2016.01) | |
| *H01F 27/02* | (2006.01) | |
| *H01F 27/10* | (2006.01) | |
| *H01F 38/14* | (2006.01) | |
| *H05K 7/14* | (2006.01) | |

(52) U.S. Cl.
CPC ......... *H05K 7/20936* (2013.01); *H01F 27/02* (2013.01); *H01F 27/10* (2013.01); *H01F 38/14* (2013.01); *H02J 50/10* (2016.02); *H05K 7/1427* (2013.01); *H05K 7/20336* (2013.01); *H05K 7/20409* (2013.01)

(58) Field of Classification Search
CPC ............ H05K 7/1427; H05K 7/20336; H05K 7/2089; H05K 7/20936; H05K 7/1432; H05K 7/20409; H01F 27/02; H01F 27/10; H01F 38/14; H02J 50/10
See application file for complete search history.

(56) References Cited

U.S. PATENT DOCUMENTS

| 5,545,966 A | 8/1996 | Ramos et al. |
| 7,492,247 B2 | 2/2009 | Schmidt et al. |

(Continued)

FOREIGN PATENT DOCUMENTS

| DE | S9508133 T2 | 7/1999 |
| DE | 10312284 A1 | 10/2004 |

(Continued)

*Primary Examiner* — Jacob R Crum
(74) *Attorney, Agent, or Firm* — The Webb Law Firm

(57) ABSTRACT

A receiving device for a system for inductive power transfer has a housing with a cover part and a base part as housing parts. The housing includes an inside volume for accommodating at least one winding structure. At least one of the housing parts has at least one heat sink on an outer side. A method for producing the receiving device is also disclosed.

10 Claims, 6 Drawing Sheets

(56) References Cited

U.S. PATENT DOCUMENTS

| | | |
|---|---|---|
| 8,760,253 B2 | 6/2014 | Hickox |
| 9,711,995 B2 | 7/2017 | Yuasa |
| 9,806,540 B2 | 10/2017 | Anders et al. |
| 2005/0147839 A1* | 7/2005 | Suwa .................. H01L 23/488 |
| | | 428/624 |
| 2012/0218068 A1 | 8/2012 | Yamakawa et al. |
| 2012/0227937 A1* | 9/2012 | Luo .................. F28D 15/0275 |
| | | 165/104.26 |
| 2012/0235421 A1* | 9/2012 | Wong .................. F03D 80/60 |
| | | 290/55 |
| 2012/0249031 A1* | 10/2012 | Leon .................. H05K 7/1432 |
| | | 318/400.26 |
| 2013/0181797 A1 | 7/2013 | Hickox |
| 2013/0329367 A1* | 12/2013 | Huang .............. H05K 7/20445 |
| | | 361/704 |
| 2015/0364924 A1* | 12/2015 | Yuasa .................. B60L 53/12 |
| | | 307/104 |
| 2016/0072304 A1* | 3/2016 | Anders .................. H02J 5/005 |
| | | 307/104 |
| 2017/0221793 A1* | 8/2017 | Smalley .................. H01L 24/00 |

FOREIGN PATENT DOCUMENTS

| | | |
|---|---|---|
| EP | 2493016 A2 | 8/2012 |
| EP | 2618344 A1 | 7/2013 |
| EP | 2960910 A1 | 12/2015 |
| WO | 2014166963 A1 | 10/2015 |
| WO | 2015150297 A2 | 10/2015 |
| WO | 2018138127 A1 | 8/2018 |
| WO | 2018138130 A1 | 8/2018 |

* cited by examiner

RECEIVING DEVICE AND METHOD FOR PRODUCTION

CROSS-REFERENCE TO RELATED APPLICATIONS

This application is the United States national phase of International Application No. PCT/EP2018/051686 filed Jan. 24, 2018, and claims priority to German Patent Application No. 10 2017 101 582.5 filed Jan. 26, 2017, the disclosures of which are hereby incorporated by reference in their entirety.

BACKGROUND OF THE INVENTION

Field of the Invention

The invention relates to a receiving device for a system for inductive power transfer and to a method for producing such a receiving device.

In particular, the invention relates to a receiving device for receiving an electromagnetic field and for providing electric energy in an induction-based manner, in particular for the use by a vehicle, further in particular by an automobile.

An application of the invention may be, in particular, in the field of wireless energy transmission to vehicles, such as automobiles, buses, vans, trucks, forklift trucks and rail vehicles. For this purpose, the receiving device can, in particular, be designed to provide electric power in the range of several kilowatts, for example 20 kW.

DESCRIPTION OF RELATED ART

While traveling on a roadway, a vehicle may need energy for driving purposes and for operating additional units not used to drive the vehicle. Additional units may include, for example, a lighting system, a heating system and/or an air conditioning system, a ventilation system and an information system. Furthermore, it is known that it is possible to operate not only rail-bound vehicles, such as street cars, but also road vehicles with electric energy.

Vehicles, in particular electric vehicles, can be supplied with electric energy in a variety of ways. One option is to charge a battery installed in the vehicle when the vehicle is stationary. For this purpose, a cable connection can be established to the vehicle. Another option is to transfer energy wirelessly to the vehicle, wherein an electromagnetic field is utilized which induces a voltage in the vehicle in at least one inductance. The term "receiving device" or "pick-up" can denote a device that comprises such an inductance.

The induction-based transfer of electric energy to the vehicle forms the background of the present invention. A roadway-side conductor system, which can also be referred to as a primary winding structure, generates an electromagnetic field for power transfer. This field is received in the vehicle by a conductor system arranged in the vehicle, which can also be referred to as a secondary winding structure or secondary coil, wherein the electromagnetic field generates a voltage by induction. The energy thus transferred can be used to drive the vehicle and/or for other uses, such as to supply additional units of the vehicle with power. The vehicle can be a vehicle comprising an electrically operable drive motor, for example. However, the vehicle can also comprise a so-called hybrid drive system, for example a system that can be operated with electric energy or another form of energy, for example through the use of fuel, such as natural gas, diesel or gasoline or hydrogen.

There is a need to integrate a receiving device comprising a secondary winding structure into existing vehicles, and in particular automobiles. A weight of the receiving device should be low so as to impair an overall weight of the vehicle as little as possible. Moreover, the design of the receiving device should be stable, and the receiving device should be easy to mount. Furthermore, existing installation spaces, in particular in the region of an underside of a vehicle, should be utilized.

Typically, the magnetic field (as part of an alternating electromagnetic field) is generated by a device, which is disposed beneath the vehicle underside. For this reason, a receiving device is typically mounted on the underside of the vehicle, so as to receive the magnetic field from beneath. However, it is also possible to orient the receiving device in other directions, such as a horizontal direction, if the device for generating the electromagnetic field is disposed in the corresponding direction, such as on a wall. In general, the receiving device includes a receiving side, wherein the magnetic field enters the receiving device from the receiving side during operation.

WO 2014/166963 A1 discloses a receiving device for receiving a magnetic field and for supplying electric energy by magnetic induction, wherein the receiving device comprises at least one coil of an electric line. Furthermore, the magnetic field induces a voltage in the coil during operation. The coil furthermore comprises an inductance, wherein the receiving device and the coil are designed to receive the magnetic field from a receiving side. The receiving device furthermore comprises a housing, which comprises the at least one coil and further components of the receiving device.

WO 2015/150297 A2 discloses a receiving device, and in particular a receiving device for a system for inductive power transfer to a vehicle, wherein the receiving device comprises a housing. Furthermore, at least one medium is arranged within the housing, wherein the medium has a lower coefficient of thermal expansion than air.

In addition to a receiving winding structure (secondary winding structure), the receiving device can comprise further electrical and electronic components. For example, the receiving device can comprise a rectifier, wherein the rectifier can comprise power electronics elements. Moreover, the receiving device can comprise measuring and control elements. These components can generate thermal energy.

During an operation of the vehicle comprising such a receiving device, large changes in the temperature can occur in the housing. So as to enable reliable operation of the receiving device, and in particular of the electrical and electronic components, it is desirable to enable reliable cooling.

This presents the technical problem of creating a receiving device and a method for producing such a receiving device, which enable reliable cooling of the receiving device, and in particular of electrical and/or electronic elements of the receiving device. The reliable cooling should also be ensured when requirements are to be met in terms of mounting the receiving device on a vehicle. SUMMARY OF THE INVENTION A receiving device for a system for inductive power transfer is proposed.

The system can be used, in particular, for inductive power transfer to a vehicle, and in particular an automobile. The receiving device comprises a housing, wherein the housing comprises a cover part and a base part as housing parts.

The housing can be mounted on a vehicle. In particular, the housing can be mounted on a vehicle frame, further in particular on a front axle support of the vehicle. Furthermore, the housing can be mounted on the vehicle on or in the region of an underside of the vehicle. The housing can comprise at least one fastening means so as to mount the vehicle on the vehicle. It is possible, for example, that the cover part and/or the base part include at least one opening, and preferably multiple openings, for receiving a screw. This allows the housing to be screwed to the vehicle.

In a mounted state, in which the receiving device is mounted on the vehicle, the cover part is disposed above the base part. Hereafter, reference can be made to the following coordinate system of the receiving device.

A vertical axis of the receiving device can be oriented perpendicularly to a top side of the cover part and a bottom side of the base part. A longitudinal axis of the receiving device can be oriented parallel to a longitudinal direction of the housing. A transverse axis (also lateral axis) of the receiving device can be oriented parallel to a transverse axis of the housing. A width of the housing along the lateral axis may be smaller than a length along the longitudinal axis. In the mounted state, the vertical axis may be oriented parallel to a vertical axis or a yaw axis of the vehicle. Furthermore, the transverse axis of the receiving device can be oriented parallel to a transverse axis or pitch axis of the vehicle. Furthermore, the longitudinal axis of the receiving device can be oriented parallel to a longitudinal axis or roll axis of the vehicle. The axes can furthermore be oriented perpendicularly with respect to one another.

Furthermore, the housing has an inside volume for accommodating at least one winding structure, and in particular the secondary winding structure. In a closed state, in which the cover part and the base part are fastened to one another, the inside volume can be surrounded by the cover and base parts. The inside volume is thus delimited by the cover and base parts.

In addition to accommodating the winding structure, the inside volume can also be used to accommodate further components of the receiving device, and in particular electrical and electronic components. These can be disposed on one, two or more printed circuit boards, for example, wherein the printed circuit boards can likewise be disposed in the inside volume. Furthermore, a magnetically conductive element, in particular a ferrite element, can be disposed in the inside volume. The receiving device can comprise these further components, printed circuit boards and/or the magnetically conductive element.

The winding structure can comprise a first partial winding and at least one further partial winding. The first partial winding and the at least one further partial winding are electrically connected.

The winding structure receives the electromagnetic field and provides an induced output voltage. In this case, the first partial winding receives a first portion of the electromagnetic field, and the second partial winding receives a further portion of the electromagnetic field, when the winding structure is exposed to the electromagnetic field. Each partial winding can provide a pole of the electromagnetic field, which is generated by the induced current.

A partial winding can comprise one or more sections of a phase line of the winding structure. The winding structure can comprise one or more phase lines for conducting an electrical current. A partial winding can comprise a predetermined surface area. A partial winding can comprise or form a coil, for example having a predetermined number of windings.

The at least one phase line can be designed in such a way that a progression of the phase line forms an even or an odd number of partial windings, which are disposed adjoining one another. In this case, a partial winding denotes a, preferably closed, conductor loop comprising the predetermined surface area. The conductor loop can comprise or form one or more windings of the corresponding partial winding.

Adjoining one another can mean that central axes of the partial windings, in particular axes of symmetry, are disposed at a distance from one another, and in particular at a predetermined distance, along a straight line. The straight line can be parallel to the longitudinal direction of the receiving device. This can mean that the phase line of the winding structure can extend along an extension direction, wherein the predetermined number of partial windings is provided along the extension direction.

Adjoining partial windings can be oppositely oriented. In this context, opposite can mean that a current flow in the first partial winding is oriented clockwise, whereas the current flow in the adjoining partial winding is oriented counter clockwise. The clockwise direction can be defined relative to parallel central axes which are oriented in the same direction. When a current flows in the partial windings, adjoining partial windings can each generate a magnetic field having the same intensity, but opposite orientation.

Preferably, the winding structure has the shape of an eight. This can mean that a course of the at least one phase line is an eight-shaped course. In this case, the phase line can comprise two, for example circular or rectangular, partial windings, which are disposed adjoining one another along the above-mentioned extension direction.

The winding structure preferably comprises a first partial winding and a second partial winding. In this case, the winding structure can also be referred to as a double-D winding structure.

According to the invention, at least one of the housing parts comprises at least one heat sink on an outer side. Preferably, the cover part comprises the at least one or more heat sinks on an outer side of the cover part. The heat sink can, in particular, be disposed and/or designed in such a way that heat emission by way of convection is made possible and, in particular, is maximized.

The heat sink can preferably be disposed on an exterior section of the housing wall, and in particular an exterior section of the cover part. An exterior section denotes a section that is in contact with an outside volume. In contrast, an interior section of the housing or of the housing wall can denote a section that is in contact with the inside volume of the housing.

The at least one heat sink can project from the housing part. In particular, the at least one heat sink can project perpendicularly from the housing part.

The cover part is made of a thermally conductive material, in particular of aluminum or an aluminum alloy. The cover part can, in particular, be produced in a die casting process. In this way, it is possible to transfer or emit thermal energy from the inside volume via the at least one housing part and via the at least one heat sink into the outside volume. This advantageously results in reliable and quantitatively sufficient cooling of the inside volume.

Furthermore according to the invention, the receiving device comprises at least one heat transfer element, wherein thermal energy can be transferred from a first predetermined spatial region in the inside volume to an interior section of the housing wall by the at least one heat transfer element. The heat transfer element can be different from the cover part. In particular, the heat transfer element can be designed as a component different from the cover part.

The at least one heat sink or a further heat sink can preferably be disposed in an exterior section of the housing wall located opposite this interior section. The interior section of the housing wall can be disposed in a spatial region of the inside volume that is different from the predetermined spatial region. Furthermore, the interior section can be the interior section against which the magnetically conductive element rests or to which the magnetically conductive element is thermally connected. Preferably, however, the interior section, to which thermal energy can be transferred by the at least one heat transfer element, is different from the aforementioned interior section. In this case, the housing can thus comprise at least two heat sinks on an outer side. The predetermined spatial region can be a region to which, during operation, a large amount of thermal energy is transferred.

As a result, thermal energy can advantageously be distributed in the inside volume, in particular to regions in which good heat transfer to the outside volume is possible.

For example, the receiving device can comprise electrical and/or electronic elements, and in particular power electronics elements, such as electronic switch elements, in particular MOSFET or IGBT, or power diodes, which can generate thermal energy. So as to achieve the lowest possible height of the housing, while achieving a central arrangement of the secondary winding structure relative to the vehicle, it may be necessary to dispose these electrical or electronic elements in edge regions of the housing, next to the secondary winding structure, which is disposed in a central region of the housing. At the same time, however, it is desirable to mount the housing on the vehicle in the most stable manner possible. For this purpose, it may be advantageous to provide appropriate fastening means, such as through-openings and/or threaded sections to accommodate screws, in these edge regions, wherein it can be assumed that mechanical fastening of edge regions of the housing on the vehicle enables more stable fastening than fastening of a central region of the housing. However, if edge regions are fastened to the vehicle, little or no installation space for heat sinks is available on the outer side of the housing, and in particular on the outer side of the cover part, in these edge regions. So as to enable good and reliable dissipation of thermal energy, to as great an extent as possible, from the inside volume in these edge regions, this thermal energy thus has to be conducted to a section of the housing wall where the corresponding exterior section comprises a heat sink.

The heat transfer element thus advantageously enables a targeted distribution of thermal energy, whereby not only good and reliable dissipation of thermal energy from the predetermined spatial region is made possible, but undesirable heating of further regions of the inside volume is avoided. This, in turn, increases the operating reliability of the receiving device.

Furthermore according to the invention, the first spatial region is a lateral edge region of the housing. A lateral edge region denotes a region on an end face of the housing along the lateral axis of the receiving device. A central region can be disposed between the lateral edge regions on the opposing end faces. The central region can have a width of 200 mm to 300 mm along the lateral axis. The central region can have a length of 200 mm to 300 mm along the longitudinal axis.

A lateral edge region can have a width along the lateral axis from a range of 10 mm to 100 mm. A lateral edge region can have a length along the longitudinal axis from a range of 200 mm to 300 mm. The lengths of the central region and of the lateral region along the longitudinal axis can be the same.

The interior section of the housing wall is disposed in the central region of the housing. It is possible for the interior section of housing wall to be disposed on a longitudinal end face.

It can be possible, due to mounting requirements on the vehicle, for heat sinks not to be able to be disposed in regions of the outer side of the housing that directly adjoin regions of the inside volume in which elements are disposed, which, in particular during operation or during reception of the magnetic field, generate thermal energy.

Overall, this advantageously results in sufficient cooling of the edge regions when the housing, for mounting on the vehicle, rests against the vehicle in these edge regions, and thus no installation space is available on an outer side of the housing in these edge regions for heat sinks.

In a further embodiment, the at least one heat sink comprises or is designed as at least one cooling fin or a cooling pin.

A cooling fin can have a rectangular cross-section. Furthermore, a cooling fin can project perpendicularly from an exterior section of the housing wall. A cooling pin can have a circular or an oval cross-section. The cooling pin can also project perpendicularly from the exterior section of the housing wall. The heat sink can preferably comprise multiple cooling fins or cooling pins.

In this way, advantageously, a large surface of the heat sink for heat emission is provided.

In a further embodiment, the receiving device comprises at least one magnetically conductive element. The magnetically conductive element can, in particular, be a ferrite element. The ferrite element can be disposed in or on a secondary winding structure of the receiving device. Furthermore, the magnetically conductive element is disposed in the inside volume. The magnetically conductive element is used to conduct a magnetic flux of the electromagnetic field for power transfer, in particular so as to achieve the best possible magnetic coupling between a primary winding structure and the secondary winding structure.

Furthermore, the magnetically conductive element, and in particular a surface of the magnetically conductive element, rests against an interior section of the housing wall. As an alternative, the magnetically conductive element is thermally connected to the interior section, in particular via a thermally conductive element, wherein the thermally conductive element can be different from air. The interior section of the housing wall can, in particular, be an interior section of the cover part.

Furthermore, the at least one heat sink can be disposed in an exterior section of the housing wall, which is a section located opposite the interior section. However, it is also possible for the at least one heat sink to be disposed in an exterior section of the housing wall which is not located opposite the interior section. In this case, the interior section and the heat sink can be thermally connected via the cover part.

The magnetically conductive element can become heated, in particular during the reception of the magnetic field. As a result of the described arrangement, a reliable transfer of a comparatively high amount of thermal energy is advantageously made possible from the magnetically conductive element via a comparatively small section of the housing wall to the at least one heat sink, and thus to the outside volume.

The magnetically conductive element can, in particular, be disposed in a central region of the housing, in particular between two lateral edge regions of the housing. The secondary winding structure can also be disposed in the central region. In particular, the edge regions can be disposed along the lateral axis of the receiving device, next to the magnetically conductive element or next to the secondary winding structure. In this case, the heat sink can also be disposed in a central section of the housing, and in particular of the cover part.

In a further embodiment, at least one thermally conductive element is disposed between the magnetically conductive element and the interior section. The thermally conductive element has, in particular, a higher thermal conductivity than air. The thermally conductive element can, in particular, be a thermal pad.

In this way, good heat transfer from the magnetically conductive element to the heat sink is advantageously made possible.

In a further embodiment, a thermally conductive element is made of silicone. In particular, the thermally conductive element can be pressed between the magnetically conductive element and the interior section of the housing wall. If the thermally conductive element is made of silicone, this may also be used to spatially fix the magnetically conductive element in the inside volume and to absorb and/or cushion vibration-induced movements of the magnetically conductive element. In this way, in addition the risk of damage to the magnetically conductive element by vibrations is advantageously reduced.

In a further embodiment, the thermally conductive element is additionally designed as an adhesive element. For example, the thermally conductive element can have a one-sided or double-sided adhesive design. For this purpose, one surface or opposing surfaces of the thermally conductive element can be provided with an adhesive layer. This advantageously results in stable mechanical fastening of the thermally conductive element on the magnetically conductive element. As an alternative or cumulatively, further elements of the receiving device can be fixed in the inside volume by the thermally conductive element. For example, the thermally conductive element can, in this case, be used to fix a signal link means, for example a (ribbon) cable or a flexible printed circuit board, on the interior section of the housing wall by gluing. In this way, it is advantageously possible, on the one hand, to minimize installation space requirements of the receiving device and, on the other hand, to ensure a desired heat transfer from the magnetically conductive element to the heat sink.

In a preferred embodiment, the heat transfer element is designed as a heat pipe. The heat pipe can, for example, be disposed in the cover part or in a guide groove of the cover part. This advantageously results in effective transfer of thermal energy to the greatest extent possible.

In a further embodiment, the heat pipe is disposed in the inside volume in such a way that a gradient of the ambient temperature of the heat pipe along the path from the first predetermined spatial region to the interior section is negative. Elements that are able to generate thermal energy can be disposed in the inside volume. The heat pipe preferably extends so as to be guided past regions (and thus not through these regions) to which thermal energy is emitted by these elements. For example, the heat pipe can extend so as not to extend along the vertical axis of the receiving device across further electrical and/or electronic elements that emit thermal energy, in particular when they are being operated.

This advantageously results in reliable dissipation of thermal energy from the first predetermined spatial region, since this dissipation is not impaired by the supply of thermal energy in other regions of the heat pipe.

In a further embodiment, the receiving device comprises at least one printed circuit board, wherein at least one electrical or electronic element is disposed on the at least one printed circuit board. The first printed circuit board or the at least one electrical or electronic element is disposed in the predetermined spatial region, that is, for example, in the lateral edge region. The electronic element can, in particular, be a power electronics component. In particular, the electronic element can be a component of a rectifier circuit of the receiving device, wherein the receiving device comprises this rectifier circuit. As an alternative, an electrical element can be a capacitor or a diode. The capacitor can be part of a compensation circuit of the receiving device for setting a reactance. The diode can likewise be part of the rectifier circuit.

This advantageously results in reliable cooling of elements that generate thermal energy during operation, whereby, in turn, a reliable operation of the elements is ensured.

In a further embodiment, the first printed circuit board and/or the at least one electrical or electronic element are thermally connected to the heat transfer element by way of at least one thermal via. This advantageously results in good and reliable transfer of thermal energy from the at least one electrical or electronic element to the heat transfer element.

In a further embodiment, the first printed circuit board and/or the at least one electrical or electronic element are thermally connected to the heat transfer element via at least one further thermally conductive element, wherein the thermally conductive element is not electrically conductive. The further thermally conductive element can, in particular, be a further thermal pad.

The further thermally conductive element, and in particular the further thermal pad, can be made of ceramic material, for example, or comprise ceramic material. In particular, the further thermally conductive element can be made of aluminum nitrite, or comprise aluminum nitrite.

Furthermore, the first printed circuit board and/or the at least one electrical or electronic element can be thermally connected to the heat transfer element via at least one thermally conductive plate. This plate can, in particular, be a copper plate.

The first printed circuit board and/or the at least one electrical or electronic element can thus be thermally connected to the heat transfer element by way of the at least one thermal via and/or the at least one further thermally conductive element and/or the thermally conductive plate. It is also possible for a thermally conductive connecting material, such as a thermal paste, to be provided between the elements of the thermal connection. The elements of the thermal connection can also be mechanically connected. For example, the thermally conductive plate can be soldered to the heat transfer element.

The first printed circuit board and/or the at least one electrical or electronic element are preferably thermally connected to the at least one further thermally conductive element by way of the at least one thermal via, wherein the further thermally conductive element is thermally connected to the thermally conductive plate, wherein the thermally conductive plate is thermally connected to the heat transfer element.

Furthermore, a method for producing a receiving device for a system for inductive power transfer is proposed, wherein a base part and a cover part are provided as housing parts of a housing of the receiving device. Furthermore, at least one of the housing parts comprises or forms at least one heat sink on an outer side.

Using the method, a receiving device according to one of the embodiments described in this disclosure can be produced. The method can thus comprise all the steps to produce such a receiving device.

Furthermore, a vehicle is described, wherein the vehicle comprises a receiving device according to one of the embodiments described in the present invention. The receiving device can be fastened on the vehicle, in particular in the region of an underside.

The receiving device can be connected to a communication system of the vehicle, for example a bus system, in terms of data and/or signaling. Furthermore, the receiving device can be electrically connected to an electrical system of the vehicle, and in particular a traction network. In this way, electric energy that is supplied to the receiving device, which is provided in an induction-based manner, can be transferred to the vehicle.

BRIEF DESCRIPTION OF THE DRAWING

The invention will be described in more detail based on an exemplary embodiment. In the drawings:

FIG. 9b shows a detailed view of a schematic longitudinal section through the cover part shown in FIG. 9a.

Hereafter, identical reference numerals denote elements that have identical or similar technical features.

DESCRIPTION OF THE INVENTION

Figure 1:
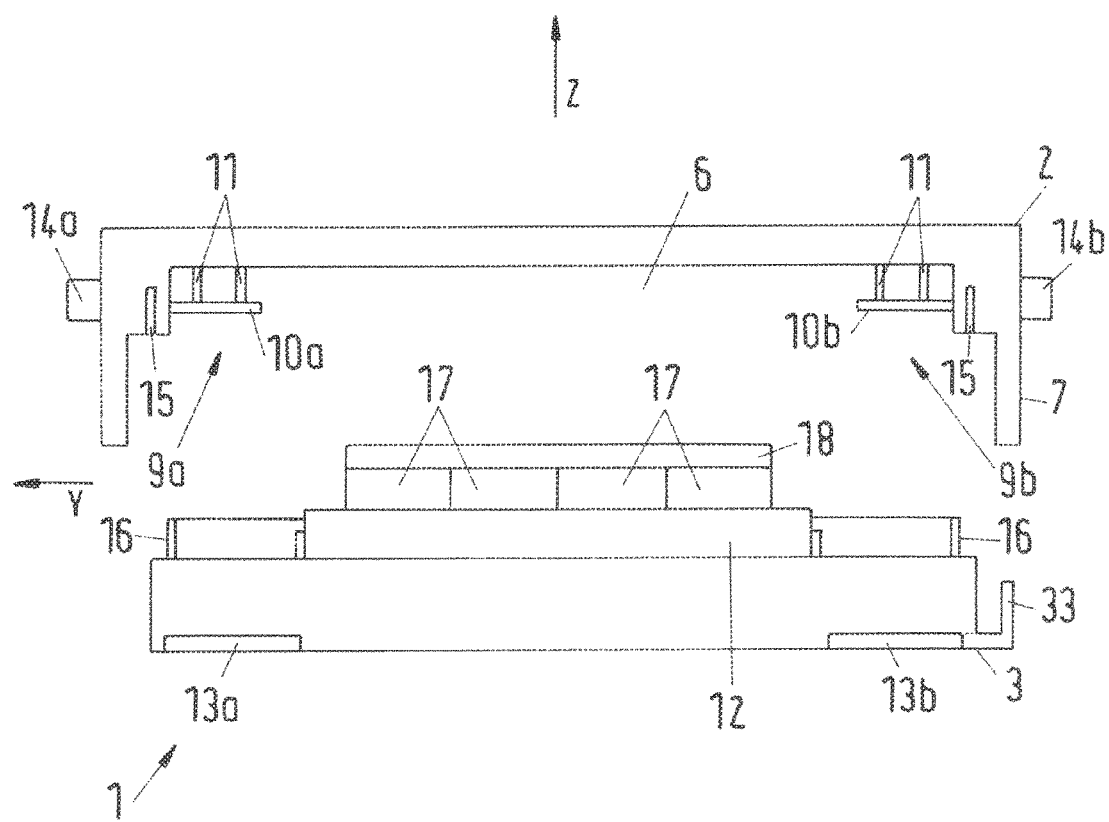
FIG. 1 shows a schematic cross-section through a receiving device according to the invention.

FIG. 1 shows a schematic cross-section through a receiving device 1 of a system for inductive energy transfer. The receiving device 1 comprises a housing, wherein the housing comprises a cover part 2 and a base part 3. The cover part 2 is made of aluminum. The base part 3 is made of plastic material, and in particular of glass fiber reinforced plastic material. The material of the base part 3, in particular thus the glass fiber reinforced plastic material, can have a coefficient of thermal expansion that is the same as the coefficient of thermal expansion of the material of the cover part 2, or does not deviate therefrom by more than a predetermined extent.

The base part 3 can be fastened to the cover part 2, whereby a closed state of the housing or of the receiving device 1 is created. In particular, the base part 3 can be screwed to the cover part 2. To provide such a screw joint, the base part 3 can include through-holes 4, 29 (see FIG. 5), and the cover part can include corresponding threaded sections 5, 27 (see FIG. 2). In the closed state, the base part 3 is completely disposed in an inside volume 6 of the cover part 2. Side walls 7 of the cover part 2 surround the sides of the base part 3 in the closed state. As an alternative or cumulatively, the cover part 2 can be glued to the base part 3.

The receiving device can be fastened to a vehicle (not shown). In particular, the receiving device 1 can be screwed to the vehicle, and in particular to a front axle support of the vehicle. So as to provide such a screw joint, the base part 3 and the cover part 2 can include mutually corresponding through-holes 8a, 8b (see FIG. 5 and FIG. 3), wherein a screw can extend through the corresponding through-holes 8a, 8b of the cover part 2 and of the base part 3 in the closed state. Furthermore, the screw can extend into a threaded section of the vehicle. As an alternative, the cover part 2 can be screwed to the vehicle, for example to the front axle support of the vehicle, by way of at least one screw joint. Furthermore, the base part 3 can be connected, and in particular screwed, to the cover part 2.

Furthermore, it is shown that the receiving device, and in particular the cover part 2, comprises a first accommodating region 9a and a second accommodating region 9b. The accommodating regions 9a, 9b are spatial sub-regions of an inside volume of the housing in the closed state.

Figure 3:
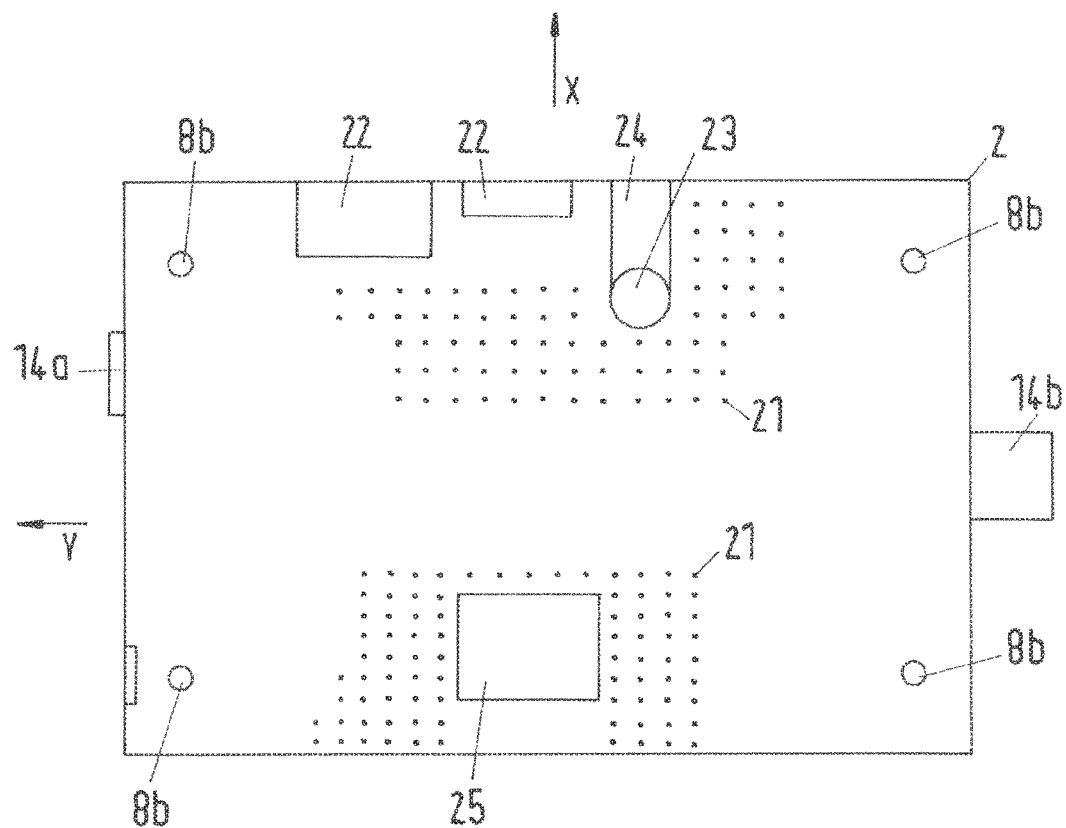
FIG. 3 shows a schematic top view of a cover part.

Hereafter, the following reference coordinate system can be used. A vertical axis z of the receiving device can be oriented orthogonally to a planar surface of the cover part 2 or to a planar bottom area of the base part 3. When the receiving device 1 is fastened to the vehicle, which can also be referred to as a mounted state, the vertical axis z can be oriented parallel to a yaw axis or vertical axis of the vehicle. Furthermore, a vertical direction can be oriented parallel to a main direction of the inductive power transfer. Furthermore, a lateral axis y of the receiving device is shown, wherein the lateral axis y is oriented perpendicularly to the vertical axis z. In the mounted state, the lateral axis y can be oriented parallel to a pitch axis or lateral axis of the vehicle. FIG. 3 shows a longitudinal axis x of the receiving device. The longitudinal axis x is oriented orthogonally to the vertical axis z and the lateral axis y. In the mounted state, the longitudinal axis x can be oriented parallel to a roll axis or longitudinal axis of the vehicle. Furthermore, the longitudinal axis x can be oriented oppositely to a driving direction of the vehicle when traveling straight ahead.

Furthermore, a vertical direction, a lateral direction and a longitudinal direction of each represented by directional arrows.

In the fastened state of the receiving device 1, the cover part 2 is mounted on the base part 3.

Furthermore, it is shown that the first accommodating region 9a is provided on a first lateral edge region of the receiving device 1, and in particular of the cover part 2. The second accommodating region 9b is provided in a second lateral edge region. The edge regions are disposed on opposing ends of the receiving device 1 relative to the lateral axis y.

An accommodating region 9a, 9b can be formed, for example, by a depression in the receiving device, and in particular in the cover part 2. As an alternative or cumulatively, an accommodating region 9a, 9b can be fixed on the receiving device 1 by fastening means for fastening a printed circuit board 10a, 10b, in particular for fastening on the cover part 2.

Furthermore, it is shown that the receiving device 1 comprises a first printed circuit board 10a and a second printed circuit board 10b. The first printed circuit board 10a is disposed in the first accommodating region 9a. Furthermore, the first printed circuit board 10a is fastened to the cover part 2. Furthermore, the second printed circuit board 10b is disposed in the second accommodating region 9b. Furthermore, the second printed circuit board 10b is fastened to the cover part 2.

In particular, the printed circuit boards 10a, 10b can be screwed to the cover part 2. To provide such a screw joint, screws 11 can extend through through-holes of the printed circuit boards 10a, 10b (not shown) into threaded sections of the cover part 2. The mechanical connection between the printed circuit boards 10a, 10b and the cover part 2 can also provide an electrical connection between the printed circuit boards 10a, 10b and the cover part 2, in particular to enable grounding of the printed circuit boards 10a, 10b.

It is possible for the cover part 2 to be electrically connected to a reference potential, for example a ground potential, of the vehicle. In this case, the electrical connection between the printed circuit boards 10a, 10b and the cover part 2 can likewise provide an electrical connection between the printed circuit boards 10a, 10b and the reference potential. The electrical connection between the cover part 2 and the reference potential of the vehicle can be provided by the mechanical connection between the receiving device and the vehicle, in particular by the screws used to fasten the receiving device 1 to the vehicle.

In the closed state of the housing or in the mounted state of the receiving device, the accommodating regions 9a, 9b are disposed laterally or next to a winding structure 12 (see FIG. 5) to receive the alternating electromagnetic field for power transfer relative to the lateral direction. The winding structure 12 can be disposed in a central section of the inside volume of the housing in the closed state.

Furthermore, it is shown that the receiving device comprises a first magnetic shielding element 13a and a second magnetic shielding element 13b. A magnetic shield element denotes an element for shielding the magnetic field. The magnetic shield elements 13a, 13b can be designed as aluminum plates. Furthermore, the magnetic shield elements 13a, 13b can be fastened to the base part 3. In particular, the magnetic shield elements 13a, 13b can be disposed in depressions on a bottom side of the base part. Furthermore, an underside of the magnetic shield elements 13a, 13b can be disposed flush with an underside of the base part 3. The first magnetic shield element 13a completely covers the first accommodating region 9a from beneath. In other words, the first magnetic shield element 13a is disposed beneath the first accommodating region 9a relative to the vertical direction. Furthermore, the first magnetic shield element 13a is disposed in such a way that the first accommodating region 9a, and in particular the first printed circuit board 10a which is disposed in the first accommodating region 9a, is completely shielded from beneath against a magnetic field. As a result, a number of magnetic field lines that extend through the accommodating regions 9a, 9b when an alternating electromagnetic field is provided for power transfer is minimized, or even reduced to zero. The magnetic shield elements 13a, 13b are disposed in such a way that an interaction of electrical and/or electronic elements, in particular elements of the printed circuit boards 10a, 10b, with the electromagnetic field for power transfer is minimized.

The first printed circuit board 10a can also be referred to as a low voltage printed circuit board. This can mean that the electrical and electronic components of the first printed circuit board 10a can be supplied with a maximum voltage of 12 V or 42 V, or provide such a voltage. The second printed circuit board 10b can also be referred to as a high voltage printed circuit board. This can mean that electrical and electronic components of the second printed circuit board 10b can be supplied with a maximum voltage of up to 1,200 V, or provide such a voltage.

In this way, components of the first printed circuit board 10a can provide control means for controlling an operation of the receiving device 1, and communication means for providing communication with the vehicle and/or a primary unit. Components of the second printed circuit board 10b can provide a desired DC voltage of the receiving device 1 from the AC voltage, which is induced in the winding structure 12 by the electromagnetic field for power transfer.

Furthermore, a first connector 14a is shown, by which a signal link and a data link to components of the first printed circuit board 10a can be established. The first connector 14a can be designed as a CAN connector, for example. At least a portion of the first connector 14a is disposed on an outer surface of a side wall of the cover part 2. Furthermore, a second connector 14b is shown, which can also be referred to as a power connector or DC voltage interface. A connection for power transfer and, optionally, for signal transmission between components of the second printed circuit board 10b and the vehicle can be established by the second connector 14b. The second connector 14b can likewise be disposed on an outer surface of a side wall of the cover part. The second connector 14b can be a connector having a screwed cable gland so as to ensure that the inside volume of the housing is sealed in the closed state.

Furthermore, a groove 15 of a tongue-and-groove joint is shown. The groove 15 is provided in an edge region of the cover part 2. In particular, the groove 15 is a peripheral groove. The groove 15 is used to accommodate a sealing element, and in particular a peripheral sealing element (not shown).

The base part 3 includes the corresponding tongue 16 of the tongue-and-groove joint. The tongue 16 is provided in an edge region of the base part 3 and on a top side of the base part 3. In particular, the tongue 16 is provided by a ridge projecting from the top side of the base part 3.

In the closed state of the housing, the tongue 16 extends into the groove 15 and clamps the sealing element in the groove 15. In this way, robust and reliable sealing of the inside volume of the housing, in which the printed circuit boards 10a, 10b and the winding structure 12 are disposed, can be established. The tongue 16 can also be designed as a peripheral tongue.

Furthermore, ferrite rods 17 are shown, which are part of a ferrite system and provide magnetically conductive elements. It is shown that the ferrite rods 17 are disposed in and on the winding structure 12, and in particular above a central section of the winding structure 12. The ferrite rods 17 and the winding structure 12 can be fastened to the base part 3. In particular, the winding structure 12 and the ferrite rods 17 can be potted with the base part 3. The ferrite rods 17 can be disposed in such a way that a desired course of flux lines of the magnetic field is created.

It is possible that upper ferrite rods 17b (see FIG. 6) are not completely potted or covered with potting material. This advantageously results in a defined height of the ferrite rod arrangement since no height deviation is created by the potting material. Preferably, however, lower ferrite rods 17a and the connecting region between the upper and lower ferrite rods 17a, 17b are completely potted.

Along a top side of the upper ferrite rods 17b, an adhesive tape can be run so as to fasten the upper ferrite rods 17b to the lower ferrite rods 17a or to the base part 3. In this way, splintering of the upper ferrite rods 17a in the event of vibrations can advantageously be prevented.

Furthermore, a thermal pad 18 is shown, which forms a thermally conductive element. The thermal pad 18 is disposed on the ferrite rods 17, and in particular on the upper ferrite rods 17a. The thermal pad 18 can have high thermal conductivity. In the closed state of the housing, the thermal pad can make contact with an interior section of a housing wall and the ferrite rods 17, and thereby establish a thermal connection between the ferrite rods 17 and the cover part 2. The thermal pad 18 can comprise silicone.

Furthermore, the thermal pad 18 can provide an adhesive element. It is possible, for example, for the thermal pad to be designed as a double-sided adhesive element or one-sided adhesive element. In this way, the thermal pad 18 can be utilized to secure a ribbon cable 36 in an accommodating groove 37 of the cover part 2 (see FIG. 4).

In other words, the receiving device 1 can comprise at least one thermally conductive element, wherein the thermally conductive element establishes a thermal connection between the cover part 2 and the winding structure 12 or a ferrite system in a closed state of the housing. In particular, the thermally conductive element can establish a mechanical contact with the cover part 2 and the winding structure 12 or the ferrite system.

Figure 2:
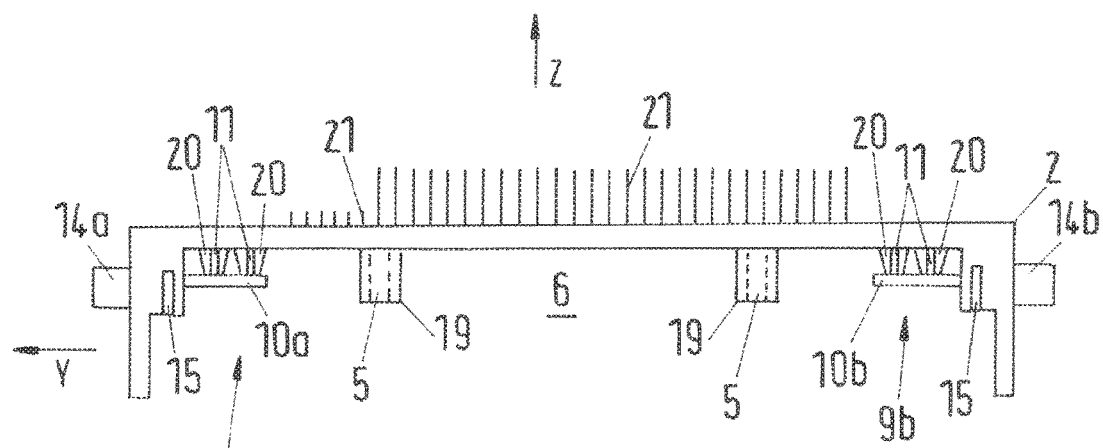
FIG. 2 shows a schematic cross-section through a cover part.

FIG. 2 shows a schematic cross-section through a cover part 2. Shown are the printed circuit boards 10a, 10b, which are fastened to the cover part 2 by way of screws 11. Furthermore, the groove 15 of the tongue-and-groove joint is shown. Furthermore, cylindrical elevations 19 are shown on an underside of the cover part 2, which include a threaded section for accommodating the screws 11 for fastening the base part 3 to the cover part 2.

Furthermore, conical elevations 20 of the cover part 2 are shown, in particular on an underside of the cover part 2, which extend into the inside volume 6 of the cover part 2 and provide the threads for the screws 11 for fastening the printed circuit boards 10a, 10b to the cover part 2. These conical elevations 20 are each disposed in the accommodating regions 9a, 9b and extend through through-holes in the printed circuit boards 10a, 10b (not shown). This advantageously allows the printed circuit boards 10a, 10b to be aligned in the corresponding accommodating region 9a, 9b. Furthermore, cooling rods 21 are shown, which are disposed on a top side of the cover part 2. The cooling rods 21 can have different lengths. The length can be selected corresponding to the installation space conditions.

The cooling rods 21 can be disposed in a central section of the cover part 2. In particular, the cooling rods 21 can be disposed outside of volumes that are disposed above the accommodating regions 9a, 9b or above the printed circuit boards 10a, 10b. The cooling rods 21 allow thermal energy to be transferred from the cover part 2 into a surrounding area by convection.

FIG. 3 shows a schematic top view of a cover part 2. Shown are the through-holes 8b for accommodating screws so as to fasten the receiving device 1 to the vehicle. Furthermore, cooling rods 21 are shown, which project from a top side of the cover part 2. Furthermore, depressions 22 in the top side of the cover part 2 are shown. These depressions 22 reduce an inside volume of the housing in the closed state of the housing. In particular, the depressions 22 can reduce an air volume in the inside volume of the receiving device 1. This, in turn, can reduce a change of a pressure in the inside volume due to temperature changes. It is possible for temperatures in the receiving device 1 to vary between −40° C. and 120° C. These temperature changes can depend on a temperature change of the outside temperature and on thermal energy generated by electrical and electronic components in the inside volume, and in particular by components of the second printed circuit board 10b. The temperature changes can result in a change of the pressure in the inside volume. A reduction of the inside volume thus advantageously allows a reduction of an extent of the pressure change.

Furthermore, a first membrane element 23 is shown. The first membrane element 23 is designed as a semi-permeable, vapor-permeable element. In particular, the vapor-permeable membrane element 23 allows vapor from the inside volume of the receiving device to exit through the membrane element 23 in a closed state of the housing. The first membrane element 23 extends through the cover part 2. On the top side of the cover part 2, the membrane element 23 is disposed in an inclined channel 24 for water to drain.

Furthermore, a second membrane element 25 is shown. The second membrane element is provided by a flexible, non-permeable, and in particular not vapor-permeable, material, for example by an elastomer, and in particular by silicone, a thermoplastic elastomer, or other plastic materials such as polyvinyl chloride or EDPM (ethylene propylene diene). The second membrane element 25 advantageously allows the inside volume of the receiving device 1 to change in the closed state of the housing. As a result of the above-described temperature changes, a pressure in the inside volume can exceed a maximum permissible pressure. The second membrane element 25 can, in particular, be designed so as to deform at a pressure that is greater than a predetermined pressure.

In particular, when the first membrane element 23 does not allow vapor to diffuse from the inside volume of the housing into a surrounding area, the second membrane element 25 allows the pressure in the inside volume to be within certain limits as a result of deformation. Vapor diffusion may not be possible, for example, when the first membrane element 23 is covered with water, for example when the vehicle is driving through a deep puddle.

Figure 4:
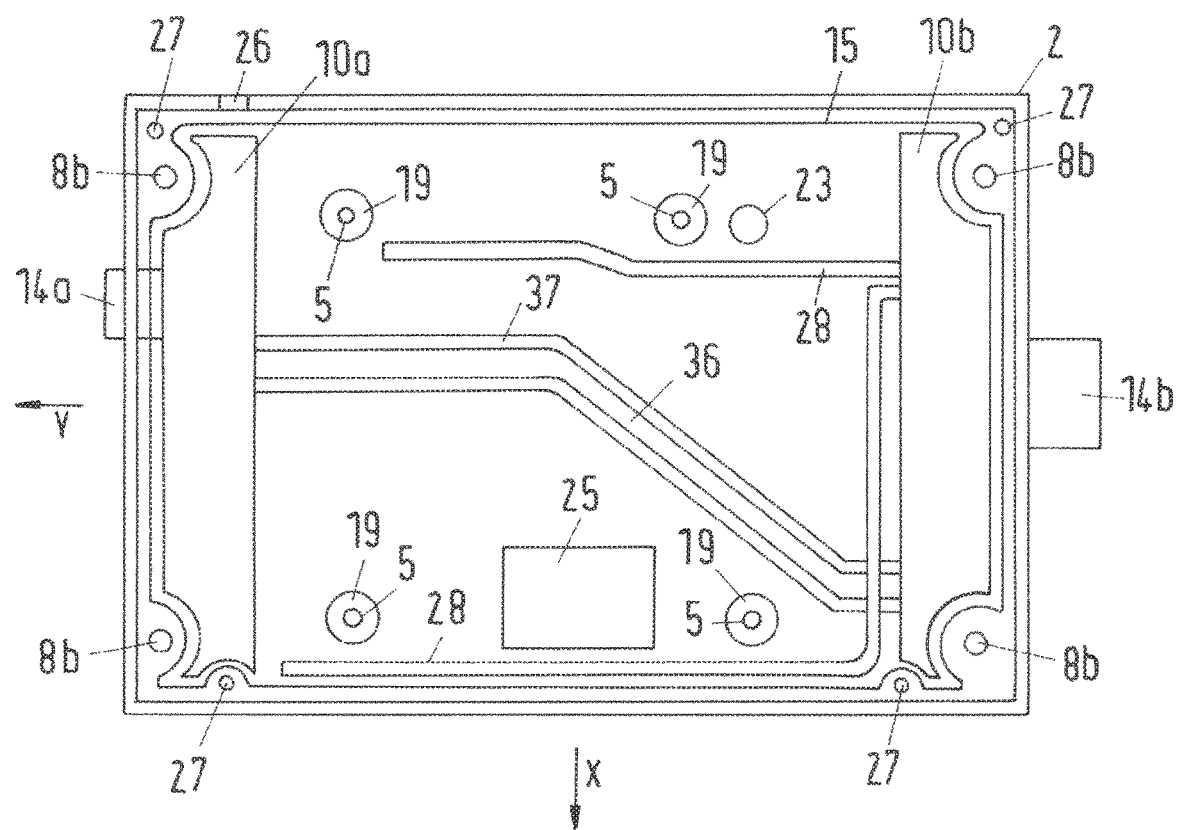
FIG. 4 shows a schematic bottom view of a cover part.

FIG. 4 shows a schematic bottom view of a cover part 2, in particular of the embodiments shown in FIGS. 1 to 3 and in FIGS. 7 to 9a, 9b. Shown are the printed circuit boards 10a, 10b. An edge region of the cover part 2, and in particular an edge region that encloses the first printed circuit board 10a, includes a depression 26 to accommodate a tab 32 (see FIG. 5) of the first magnetic shield element 13a. The tab 32 connects the first magnetic shield element 13a to the cover part 2, thereby establishing an electrical connection between the first shield element 13a and thus to the reference potential of the vehicle.

Furthermore, cylindrical elevations 19 including the threaded section 5 are shown. Furthermore, the first and second membrane elements 23, 25 are shown. Furthermore, threaded sections 27 in the cover part 2 are shown, which allow the base part 3 to be screwed to the cover part 2. Furthermore, the groove 15 of the tongue-and-groove joint is shown, which surrounds the printed circuit boards 10a, 10b and a central section of the cover part 2.

Furthermore, an accommodating groove 37 for accommodating a ribbon cable 36 is shown. The ribbon cable 36 establishes a data and signal link between components of the first printed circuit board 10a and components of the second printed circuit board 10b. The ribbon cable 36 can be secured in the accommodating groove 37 by adhesive elements. It is possible for the adhesive elements to be provided by thermal pads 18 (see FIG. 1).

Instead of the ribbon cable 36, it is also possible to use a flexible printed circuit board for establishing the data and signal link. The flexible printed circuit board can, in particular, be designed to be adhesive on one side. In this case, the cover part 2 may not include an accommodating groove 37.

Furthermore, a different path of the accommodating groove 37 shown in FIG. 4, and of a ribbon cable 36 disposed therein, or a different path of a flexible printed circuit board is conceivable. It is shown in FIG. 4, for example, that the accommodating groove 37 extends through a region in which ferrite rods 17 (see FIG. 1) or a thermal pad 18 rest against the cover part 2. However, it is also conceivable for the accommodating groove 37 and a ribbon cable 36 disposed therein, or a flexible printed circuit board, to be disposed so as to be routed around the region in which the ferrite rods 17 or the thermal pad 18 rest against the cover part 2.

Furthermore, heat transfer means designed as heat-conducting pipes 28 are shown, wherein the heat-conducting pipes 28 extend from the second printed circuit board 10b into the central region of the cover part 2. In particular, the heat-conducting pipes 28 extend from the second printed circuit board 10b into a region beneath the cooling rods 21 (see FIG. 2 and FIG. 3). The heat-conducting pipes 28 allow thermal energy to be transferred from the second printed circuit board 10b, and in particular from heat-generating components of the second printed circuit board 10b, such as power electronics components, into the central region. The heat transfer means thus extends from a lateral edge region of the housing, namely from the accommodating region 9b, to an interior section of the housing, namely the central region of the cover part.

This, in turn, enables the distribution of thermal energy inside the receiving device 1, which advantageously reduces a thermal load of the second printed circuit board 10b and of the components thereof.

The heat-conducting pipes can be disposed in accommodating grooves of the cover part 2, and in particular in accommodating grooves in inner wall sections of the cover part 2.

It is shown that the heat-conducting pipes 28 include curved and straight sections. In this way, heat can be transferred along a path along which a gradient of an ambient temperature of the heat-conducting pipe 28 is negative. In particular, a heat-conducting pipe 28 can be routed past ferrite rods 17 at a predetermined distance.

Figure 5:
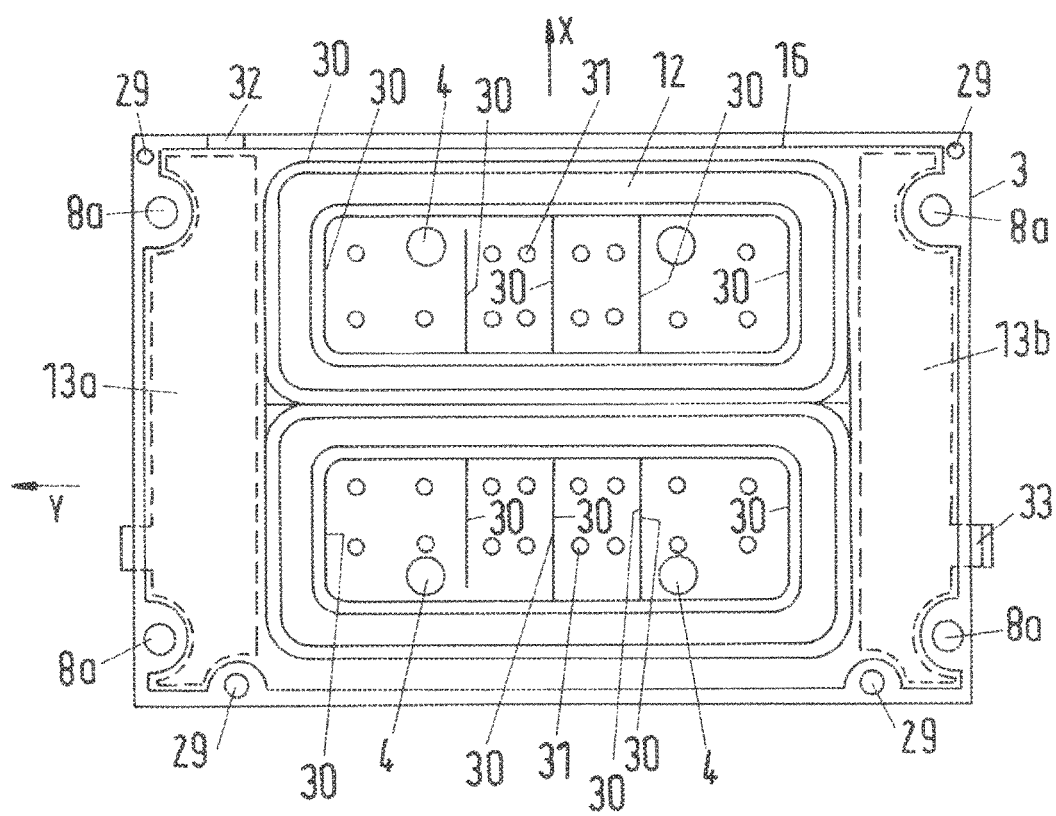
FIG. 5 shows a schematic top view of a base part.

FIG. 5 shows a schematic top view of a base part 3. Shown are the through-holes 4 and further through-holes 29 for providing a screw joint between the base part 3 and the cover part 2. Furthermore, the through-holes 8a for providing a screw joint between the receiving device 1 and the vehicle are shown. Furthermore, the tongue 16 of the tongue-and-groove connection is shown. Dotted lines illustrate the magnetic shield elements 13a, 13b.

Furthermore, ridges 30 are shown, which project from a top side of the base part 3. These ridges 30 surround an accommodating region for the winding structure 12 and for the ferrite rods 17 (see FIG. 1), and thus define the accommodating region. Furthermore, the ridges 30 define an accommodating region for potting material for potting the ferrite rods 17 and the winding structure 12. Furthermore, the projecting ridges increase a mechanical stability of the base part 3.

The projecting ridges 30 are disposed in a central region of the base part 3, and in particular in a region between the volumes above the magnetic shield elements 13a, 13b.

Furthermore, cylindrical elevations 31 on a top side of the base part 3 are shown. These elevations 31 are provided in the accommodating regions for the ferrite rods 17. For the sake of clarity, only two cylindrical elevations 31 are denoted by reference numerals. These cylindrical elevations 31 serve as spacer elements so as to provide a desired distance between a top side of the base part 3 and an underside of a ferrite rod 17.

Furthermore, a tab 32 is shown, which electrically connects the first magnetic shield element 13a to the cover part 2. Furthermore, a tab 33 is shown, which connects the second magnetic shield element 13 to the cover part 2.

Figure 6:
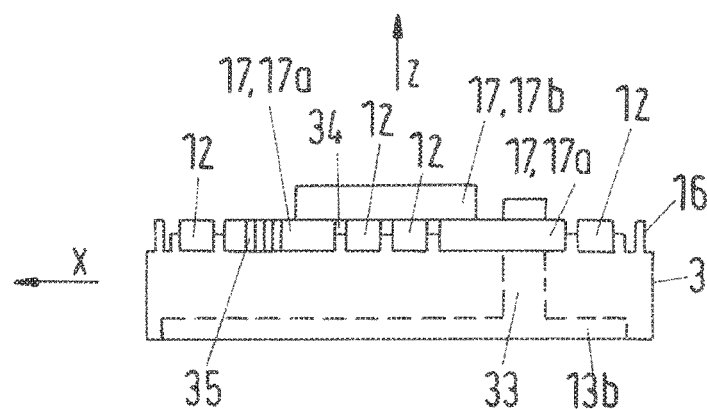
FIG. 6 shows a schematic longitudinal sectional view through a base part.

FIG. 6 shows a schematic longitudinal sectional view through a base part 3. Shown is the groove of the tongue-and-groove joint between the base part 3 and the cover part 2. Furthermore, the second magnetic shield element 13b including the tab 33 is shown.

Furthermore, the winding structure 12 is shown, wherein the winding structure 12 is provided by an above-described double-D winding structure. Furthermore, ferrite rods 17 are shown, wherein lower ferrite rods 17a are disposed beneath an upper ferrite rod 17b. The arrangement of the ferrite rods 17a, 17b provides a recess 34 for accommodating a central section of the winding structure 12. Not shown is a potting compound for the ferrite rods 17a, 17b and the winding structure 12.

Furthermore, an antenna element 35 is shown, which provides an antenna winding structure that is wound around one of the lower ferrite rods 17a. The antenna element 35 can be used to establish a wireless signal link between components of the first printed circuit board 10a and a primary unit.

Figure 7:
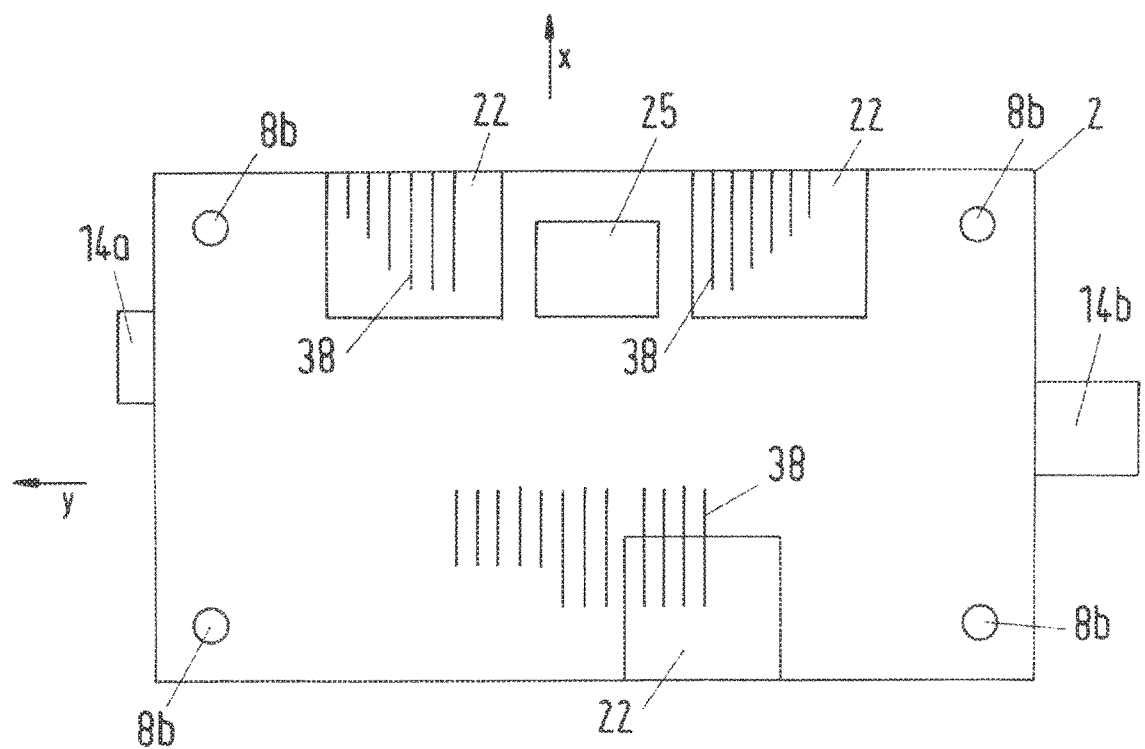
FIG. 7 shows a schematic top view of a cover part in a further embodiment.

FIG. 7 shows a schematic top view of a cover part 2 in a further embodiment. In contrast to the embodiment shown in FIG. 3, cooling fins 38 are disposed on the cover part 2, wherein the cooling fins 38 project from a top side of the cover part 2. It is shown that at least some of the cooling fins 38 can be disposed in the region of depressions 22 in the top side of the cover part 2. However, it is also possible for cooling fins 38 to be disposed completely inside or completely outside these depressions 22 on the top side of the cover part 2. Furthermore, the second membrane element 25 described in the embodiment shown in FIG. 3 and the through-holes 8b for accommodating screws are shown, so as to fasten the receiving device 1, and in particular the cover part 2, to the vehicle.

Figure 8:
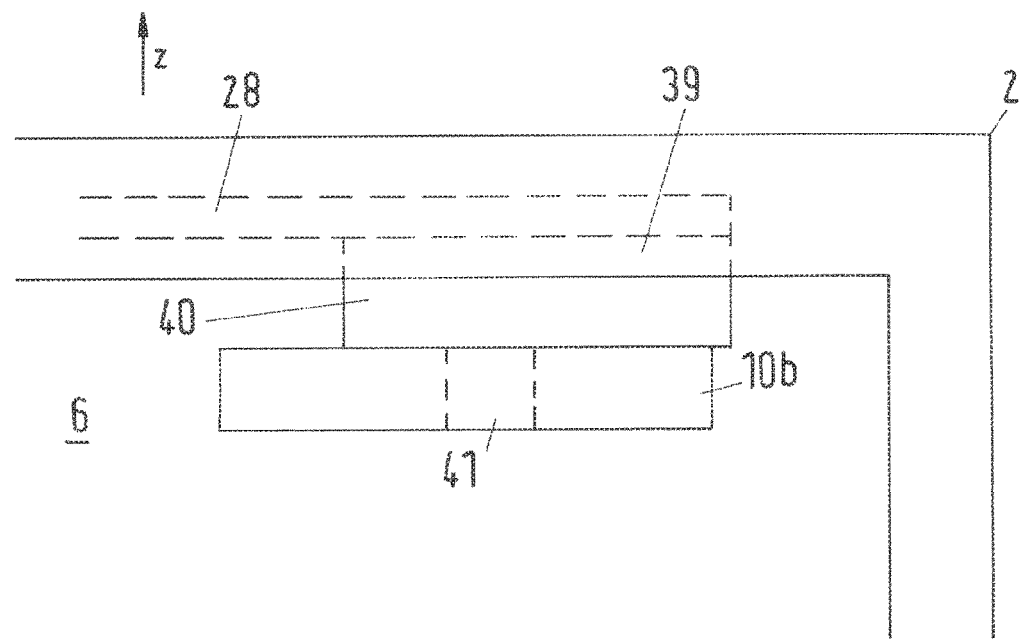
FIG. 8 shows a detailed view of a schematic longitudinal sectional view through a cover part.

FIG. 8 shows a detailed view of a schematic cross-section through a cover part 2 in a further embodiment. Shown is a heat-conducting pipe 28, which is disposed in an accommodating groove of the cover part 2. Furthermore, a copper plate 39 is shown, which is likewise disposed in a recess on an inner wall section of the cover part 2. The copper plate 39 is mechanically connected, and in particular soldered, to the heat-conducting pipe 28, in particular an end section of the heat-conducting pipe 28. In this way, a thermal connection is provided between the copper plate 39 and the heat-conducting pipe 28.

Furthermore, a further thermal pad 40 is shown, which can be made of aluminum nitrite or can comprise aluminum nitrite. The further thermal pad 40 rests against an underside of the copper plate 39. A thermal paste can be provided between the further thermal pad 40 and the copper plate 39. The further thermal pad 40 thus rests against a surface of the copper plate 39, which is located opposite the surface of the copper plate 39 to which the heat-conducting pipe 28 is fastened. The further printed circuit board 10b rests against an underside of the further thermal pad 40. Thermal paste can likewise be provided between the underside of the further thermal pad 40 and the top side of the further printed circuit board 10b. Furthermore, a thermal via 41 is schematically shown, by way of which electronic elements, and in particular heat-producing elements on the underside of the further printed circuit board 10b can be thermally connected to the further thermal pad 40.

A thickness of the further printed circuit board 10b can be in a range of 1.2 mm to 1.4 mm. A thickness of the further thermal pad 40 can be in a range of 0.4 mm to 0.6 mm. A thickness of the copper plate 39 can be in a range of 0.9 mm to 1.1 mm. A thickness of a layer of thermal paste can be in a range of 0.05 mm to 0.15 mm.

Figure 9A:
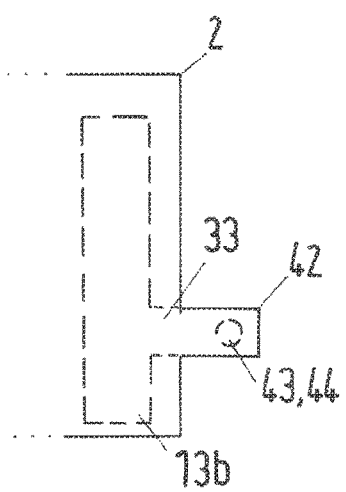
FIG. 9a shows a schematic top view of a cover part.

FIG. 9a shows a detail of a top view of a cover part 2. It is shown that the cover part 2 can comprise or form a projecting section 42, wherein the projecting section 42 can project from an edge region, and in particular a lateral edge region, of the cover part 2. Furthermore, the second magnetic shield element 13b, which comprises or forms a tab 33, is shown. A through-opening 43 can be provided in the tab 33. A threaded section 44 can be provided in the projecting section 42 of the cover part 2. In this way, it is possible to electrically and mechanically connect the tab 33 of the second magnetic shield element 13b by way of a screw to the cover part 2, wherein the screw can extend through the through-opening 43 of the tab 33 into the threaded section 44.

Figure 9B:
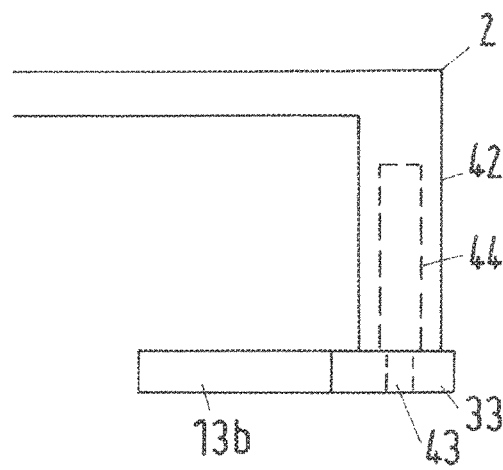

FIG. 9b shows a detail of a schematic cross-section of the cover part 2 including the second magnetic shield element 13b. In particular, the tab 33 of the second magnetic shield element 13b, the through-opening 43 in the tab 33, and the threaded section 44 in the projecting section 42 of the cover part 2 are apparent.

Accordingly, the first magnetic shield element 13a (see FIG. 1, for example) can also be electrically connected to the cover part 2.

The invention claimed is:

1. A receiving device for a system for inductive power transfer, the receiving device comprising:
    a housing comprising a cover part and a base part as housing parts, the housing including an inside volume for accommodating at least one winding structure,
    wherein at least one of the housing parts comprises at least one heat sink on an outer side,
    wherein the receiving device comprises at least one heat transfer element, thermal energy being transferrable by the at least one heat transfer element from a first predetermined spatial region in the inside volume to an interior section of a housing wall,
    wherein the first predetermined spatial region is a lateral edge region of the housing,
    wherein the interior section of the housing wall is disposed in a central region of the housing defined between two lateral edge regions of the housing,
    wherein the receiving device comprises at least one magnetically conductive element, the magnetically conductive element being disposed in the inside volume and in the central region of the housing, the magnetically conductive element being seated against the interior section of the housing wall or being thermally connected to the interior section, and
    wherein the receiving device comprises at least one printed circuit board and at least one electrical or electronic element being disposed on the at least one printed circuit board, the printed circuit board or the at least one electrical or electronic element being disposed in the first predetermined spatial region.

2. The receiving device according to claim 1, wherein the at least one heat sink comprises at least one cooling fin or a cooling pin.

3. The receiving device according to claim 1, wherein at least one thermally conductive element is disposed between the magnetically conductive element and the interior section.

4. The receiving device according to claim 3, wherein the at least one thermally conductive element is made of silicone.

5. The receiving device according to claim 3, wherein the at least one thermally conductive element is an adhesive element.

6. The receiving device according to claim 1, wherein the at least one heat transfer element is a heat pipe.

7. The receiving device according to claim 6, wherein the heat pipe is disposed in the inside volume such that a gradient of an ambient temperature of the heat pipe along a path from the first predetermined spatial region to the interior section is negative.

8. The receiving device according to claim 1, wherein at least one of the printed circuit board and the electrical or electronic element are thermally connected to the at least one heat transfer element.

9. The receiving device according to claim 8, wherein at least one of the printed circuit board and the electrical or electronic element are thermally connected to the heat transfer element via at least one further thermally conductive element, the further thermally conductive element not being electrically conductive.

10. A method for producing a receiving device for a system for inductive power transfer, the method comprising:
    providing a base part and a cover part as housing parts of a housing of the receiving device,
    wherein at least one of the housing parts comprises or forms at least one heat sink on an outer side,
    wherein the receiving device comprises at least one heat transfer element, thermal energy being transferrable by the at least one heat transfer element from a first predetermined spatial region in an inside volume of the housing to an interior section of a housing wall,
    wherein the first predetermined spatial region is a lateral edge region of the housing, and
    wherein the interior section of the housing wall is disposed in a central region of the housing defined between two lateral edge regions of the housing,
    wherein the receiving device comprises at least one magnetically conductive element, the magnetically conductive element being disposed in the inside volume and in the central region of the housing, the magnetically conductive element being seated against the interior section of the housing wall or being thermally connected to the interior section, and
    wherein the receiving device comprises at least one printed circuit board and at least one electrical or electronic element being disposed on the at least one printed circuit board, the printed circuit board or the at least one electrical or electronic element being disposed in the first predetermined spatial region.

* * * * *

UNITED STATES PATENT AND TRADEMARK OFFICE
CERTIFICATE OF CORRECTION

PATENT NO. : 10,905,034 B2
APPLICATION NO. : 16/480768
DATED : January 26, 2021
INVENTOR(S) : Simon Wechsler et al.

Page 1 of 1

It is certified that error appears in the above-identified patent and that said Letters Patent is hereby corrected as shown below:

On the Title Page

Column 2, Foreign Patent Documents, Line 1, Delete "S9508133" and insert -- 69508133 --

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*